(12) United States Patent
Liu et al.

(10) Patent No.: US 11,798,828 B2
(45) Date of Patent: Oct. 24, 2023

(54) BINNING-ENHANCED DEFECT DETECTION METHOD FOR THREE-DIMENSIONAL WAFER STRUCTURES

(71) Applicant: KLA Corporation, Milpitas, CA (US)

(72) Inventors: Zhuang Liu, Milpitas, CA (US); Weifeng Zhou, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 188 days.

(21) Appl. No.: 17/356,473

(22) Filed: Jun. 23, 2021

(65) Prior Publication Data

US 2022/0076973 A1 Mar. 10, 2022

Related U.S. Application Data

(60) Provisional application No. 63/074,487, filed on Sep. 4, 2020.

(51) Int. Cl.
| | |
|---|---|
| *H01L 21/67* | (2006.01) |
| *G06T 7/00* | (2017.01) |
| *G03F 7/20* | (2006.01) |
| *G06T 7/73* | (2017.01) |
| *G03F 7/00* | (2006.01) |

(52) U.S. Cl.
CPC ...... *H01L 21/67288* (2013.01); *G03F 7/7065* (2013.01); *G06T 7/0004* (2013.01); *G06T 7/73* (2017.01); *G06T 2207/30148* (2013.01)

(58) Field of Classification Search
CPC ............ H01L 21/67288; G03F 7/7065; G06T 7/0004; G06T 7/73; G06T 2207/30148; G06T 2207/20068

USPC .......................................................... 382/149
See application file for complete search history.

(56) References Cited

U.S. PATENT DOCUMENTS

| | | | | |
|---|---|---|---|---|
| 6,151,102 | A * | 11/2000 | Nishi ................. | G03F 9/7015 250/584 |
| 6,347,150 | B1 * | 2/2002 | Hiroi ................. | G06T 7/001 382/148 |
| 6,456,951 | B1 * | 9/2002 | Maeda ................. | H01L 22/20 702/81 |
| 7,009,704 | B1 * | 3/2006 | Nikoonahad ........ | G01B 11/272 356/399 |
| 7,211,797 | B2 * | 5/2007 | Nishiyama ............ | H01J 37/026 250/311 |
| 10,823,683 | B1 * | 11/2020 | Nie ..................... | G01N 21/9505 |
| 11,356,594 | B1 * | 6/2022 | Bruguier ............. | G02B 21/361 |
| 2002/0051565 | A1 * | 5/2002 | Hiroi .................. | G06T 7/001 382/149 |

(Continued)

FOREIGN PATENT DOCUMENTS

WO 2019173170 A1 9/2019

OTHER PUBLICATIONS

WIPO, ISR for International Application No. PCT/US2021/047831, dated Dec. 21, 2021.

*Primary Examiner* — Kathleen Y Dulaney
(74) *Attorney, Agent, or Firm* — HODGSON RUSS LLP (57) ABSTRACT

Location-based binning can separate defects on different rows of channel holes in a 3D NAND structure to corresponding bins. A one-dimensional projection of an image is generated and a one-dimensional curve is formed. A mask is generated from the one-dimensional curve. Defects in the image are detected using the mask and location-based binning is performed.

18 Claims, 6 Drawing Sheets

(56) References Cited

U.S. PATENT DOCUMENTS

| | | | |
|---|---|---|---|
| 2002/0114506 A1* | 8/2002 | Hiroi | G01N 21/95684 382/149 |
| 2005/0013474 A1* | 1/2005 | Sim | G01N 21/9503 382/145 |
| 2006/0115142 A1* | 6/2006 | Sim | G06T 7/001 382/145 |
| 2007/0105029 A1* | 5/2007 | Ausschnitt | G03F 7/70633 430/30 |
| 2008/0242043 A1* | 10/2008 | Yang | G03F 7/70633 257/E21.532 |
| 2013/0035876 A1* | 2/2013 | Huang | G01N 21/956 702/40 |
| 2014/0185919 A1* | 7/2014 | Lang | G03F 7/7065 382/149 |
| 2014/0307947 A1 | 10/2014 | Kurada et al. | |
| 2015/0055295 A1 | 2/2015 | Chang et al. | |
| 2016/0261786 A1 | 9/2016 | Ahn et al. | |
| 2017/0167862 A1 | 6/2017 | Dziura et al. | |
| 2018/0103247 A1* | 4/2018 | Kolchin | G06T 7/0004 |
| 2018/0137641 A1* | 5/2018 | Chen | G06T 7/11 |
| 2018/0204315 A1* | 7/2018 | Plihal | G06T 7/0004 |
| 2018/0342051 A1* | 11/2018 | Sezginer | G06T 7/001 |
| 2019/0355601 A1* | 11/2019 | Danen | H01L 22/12 |
| 2022/0277439 A1* | 9/2022 | Ikeda | G06T 7/70 |

* cited by examiner

BINNING-ENHANCED DEFECT DETECTION METHOD FOR THREE-DIMENSIONAL WAFER STRUCTURES

CROSS-REFERENCE TO RELATED APPLICATIONS

This application claims priority to the provisional patent application filed Sep. 4, 2020 and assigned U.S. App. No. 63/074,487, the disclosure of which is hereby incorporated by reference.

FIELD OF THE DISCLOSURE

This disclosure relates to defect detection on semiconductor wafers.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As demand for smaller semiconductor devices continues to increase, it has become more difficult to shrink semiconductor devices, such as memory, due to rapidly increasing costs associated with lithography and multiple process steps associated with pitch splitting techniques. Vertical memory, such as 3D NAND memory, appears to be a promising direction for increasing memory density. Implementation of 3D NAND includes building transistors (bits) vertically, rather than orienting memory structures in a planar manner. Increasing the number of bits can be achieved with fewer process steps, relaxed lithography sizes, and lower manufacturing costs as compared with the planar approach.

3D NAND has layers with holes. Semiconductor manufacturers are usually concerned which row of these channel holes includes a defect. A defect at a hole closer to a channel can be more problematic. Many inspection systems lack the resolution to determine where the defect is located. There is a demand for improved semiconductor wafer inspection systems for implementation with vertical semiconductor devices, such as 3D NAND memory or other vertical stacks. Previous methods, such as Image-based SuperCell (IBS), were used to find defects on 3D NAND structures. However, IBS typically cannot handle local and global gray level (GL) variations, which introduced separation error. Noise can affect the results.

Therefore, improved methods and systems for defect detection are needed.

BRIEF SUMMARY OF THE DISCLOSURE

A method is provided in a first embodiment. The method includes receiving an image at a processor. The image is of a three-dimensional structure of a semiconductor wafer and can be generated by a broad-band plasma inspection system. A one-dimensional projection of the image is generated using the processor thereby forming a one-dimensional curve. A mask is generated from the one-dimensional curve of the image using the processor. Defects are detected on the image with the mask using the processor. Location-based binning of the defects is performed using the processor.

The three-dimensional structure may be a three-dimensional NAND structure.

Generating the mask can include performing an auto-correlation of the one-dimensional curve using the processor thereby determining a period and performing auto-convolution and arbitration of the period using the processor thereby determining a trench center. The trench center can be used as a reference. Trench, edge hole, transition hole, and center hole regions can be determined in the mask image using the processor.

The defects can be detected amongst pixels in a region of the mask. Detecting the defects further can include extracting a patch around a location of one of the defects. The method can further include determining a distance to a neighboring trench center using the processor. The location-based binning may be a distance-to-trench-center.

The location-based binning can separate the defects on different rows of channel holes to corresponding bins.

A non-transitory computer readable medium can store a program configured to instruct a processor to execute the method of the first embodiment.

A system is provided in a second embodiment. The system includes a stage configured to hold a semiconductor wafer; a light source configured to direct a beam of light at the semiconductor wafer on the stage; a detector configured to receive reflected light from the semiconductor wafer on the stage; and a processor in electronic communication with the detector. The light source may be a broad-band plasma source. The detector is configured to receive an image of the semiconductor wafer; generate a one-dimensional projection of the image thereby forming a one-dimensional curve; generate a mask from the one-dimensional curve of the image; detect defects on the image with the mask; and perform location-based binning of the defects.

Generating the mask can include performing an auto-correlation of the one-dimensional curve thereby determining a period and performing auto-convolution and arbitration of the period thereby determining a trench center.

The trench center can be used as a reference. Trench, edge hole, transition hole, and center hole regions can be determined in the mask image.

The defects can be detected amongst pixels in a region of the mask. Detecting the defects can further include extracting a patch around a location of one of the defects. The method can further include determining a distance to a neighboring trench center. The location-based binning can be a distance-to-trench-center.

The location-based binning can separate the defects on different rows of channel holes to corresponding bins.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

A broad-band plasma (BBP) inspection system, laser inspection system, or other optical inspection systems can be used for 3D NAND defect detection. To improve sensitivity, semiconductor manufacturers may need to differentiate defects located on trenches and different rows of channel holes instead of merely reporting all defects in the same region. Missing a hole near a trench usually has a bigger impact than particles on trenches, while center holes are dummy holes and generally less critical than other holes.

Embodiments disclosed herein use of a-priori information (e.g., periodicity, symmetry, etc.) to overcome influences of GL variations and auto-focus issue. An arbitration method can be implemented to correct trench location identification. Cross-frame borrowing logic can be used to tolerate global GL variation. Image pixels can be segmented based on their distances to trench center. Individual sensitivity can be applied to each segmentation for defect detection. The distance from defect location to trench center can be calculated for defect binning in the recipe. Compared to IBS, the embodiments disclosed herein are robust to wafer process variation and noise and also can tolerate some auto-focus issues. Separation purity also can be better than IBS. IBS separates the images based on the neighboring pixels and the local gray level variation will impact the binning performance. Embodiments disclosed herein use the pixels from the whole care area, which is more robust to tolerate the local variation.

Figure 1:
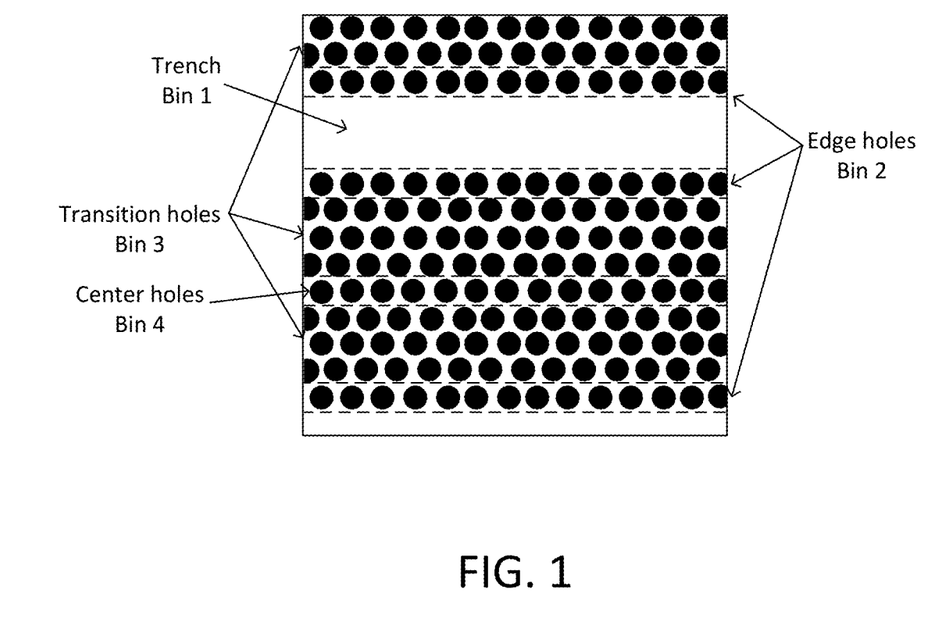
FIG. 1 is an exemplary diagram of a 3D NAND structure.
Figure 2A:
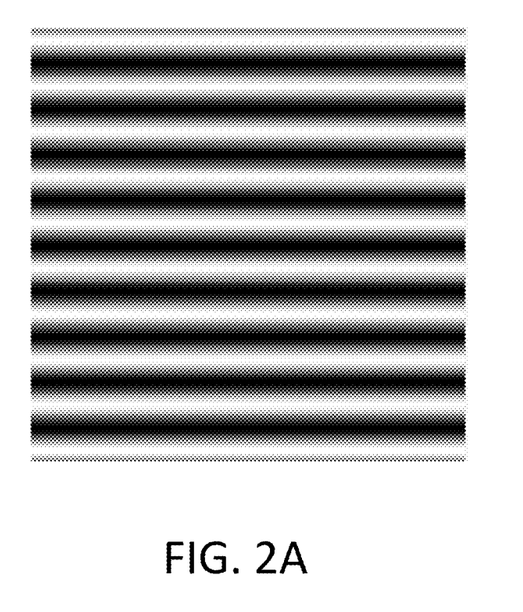
FIG. 2A illustrates a frame image.
Figure 2B:
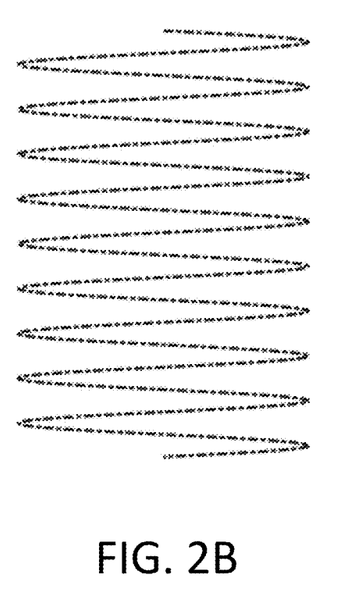
FIG. 2B illustrates a corresponding horizontal projection to FIG. 2A.

An exemplary 3D NAND structure image is shown in FIG. 1 with various features. Bins are illustrated, with Bin 0 representing the background. Each row of holes may be 100 nm to 200 nm in height. 3D NAND images are typically close to being horizontally uniform while being vertically periodic and symmetric as shown in the frame image in FIG. 2A. The image in FIG. 2A may be provided by a BBP inspection system or other inspection system. The horizontal projection of the image in FIG. 2A can be used to produce a periodic and symmetric curve as shown in FIG. 2B, which results in the mask image of FIG. 2C. This structure can increase the complexity of defect detection. Using embodiments disclosed herein, cross-correlation can help to identify the pitch and trench center. Image pixels can be segmented based on their distances to trench center. Individual sensitivity can be applied to each segmentation for defect detection. The distance from defect location to trench center can be calculated for quantitative defect binning.

Figure 3:
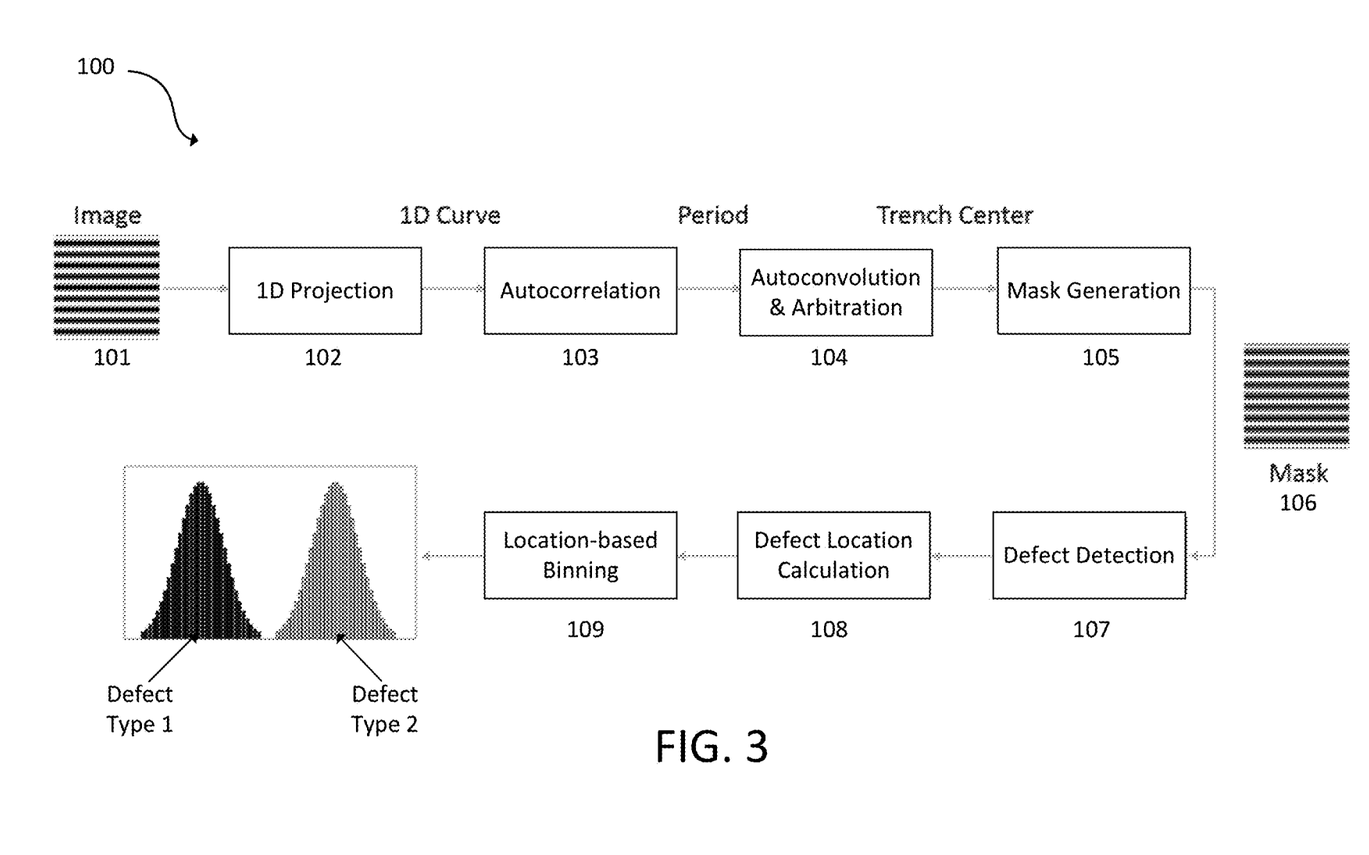
FIG. 3 is a flowchart of a method embodiment in accordance with the present disclosure.

FIG. 3 is a flowchart of a method 100. Some or all of the steps of the method 100 can use a processor.

An image 101 is used in the method 100. The image 101 is of a three-dimensional structure of a semiconductor wafer, such as a 3D NAND structure. The exemplary image, such as that shown in FIG. 1, may be from an electron beam inspection system or another type of inspection system At 102, a one-dimensional projection of the image, such as that shown in FIG. 2A, is generated thereby forming a one-dimensional curve, such as that shown in FIG. 2B. The one-dimensional projection accumulates all pixels along a dimension to determine a gray level distribution. The one-dimensional curve represents the gray level of the one-dimensional projection.

In an instance, the algorithm can take an average of the gray level of all pixels parallel to the trench in the image to generate the one-dimensional projection. The one-dimensional projection can be converted to the one-dimensional curve by using an average value output. Each row has one average value output. The values from all rows can form the one-dimensional curve.

At 103, an auto-correlation of the one-dimensional curve is performed thereby determining a period. An example of the auto-correlation function is in Eq. 6. The auto-correlation of one-dimensional curve can determine the period length of unique trench-hole pitch. Auto-correlation of one-dimensional curve also can provide trench center candidates.

In an instance, auto-correlation determines a pitch from an original profile to an offset profile. The original profile can be the one-dimensional projection profile. The offset profile can be the profile $R_x[k]$. A peak value can be examined and a peak-to-peak value is determined. This may include normalized cross-correlation (NCC).

At 104, auto-convolution and arbitration of the period is performed thereby determining a trench center. The arbitration method can be used to determine whether the candidates are trench centers or center hole rows. For example, a profile can be flipped to find a trench center during auto-convolution. Arbitration can use the dark or light peak as a center, which can be based on information from the semiconductor manufacturer. For example, a user can select a dark peak or light peak in a user interface.

An example of auto-correlation 103 and auto-convolution 104 is provided. A real-valued discrete signal x[n] is T-periodic if there exists a positive integer T such that for every n∈Z, x[n]=x[n+T]. The signal x[n] is M-symmetric if there exists an integer M such that for every n∈ Z, x[n]=x[M−n]. In this case, M/2 is one of the symmetric centers and is not necessarily unique.

If a signal is both T-periodic and M-symmetric, then it also is (M+jT)-symmetric, where j is an arbitrary integer. For a fixed integer j, x[n]=x[M−n]=x[M+jT−n] for all n ∈ Z. Therefore, x[n] is also (M+jT)-symmetric. This means that a periodic and symmetric signal contain a series of symmetric center with half-cycle spacing.

The autocorrelation function at lag k for a discrete signal x[n] can be defined as $R_x[k]=\Sigma_{n\in Z}(x[n])(x[n+k])$. The autoconvolution function at lag k for a discrete signal x[n] can be defined as $V_x[k]=\Sigma_{n\in Z}(x[n])(x[k-n])$, which can be viewed as the cross-correlation of x[n] with its reversion x[−n]. Thus, the following equations apply.

$$R_x[k+T]=\Sigma_{n\in Z}(x[n])(x[n\ k+T])=\Sigma_{n\in Z}(x[n])(x[n\ k])=R_x[k] \quad \text{(Eq. 1)}$$

$$V_x[k+T]=\Sigma_{n\in Z}(x[n])(x[k+T-n])=V_x[k] \quad \text{(Eq. 2)}$$

If x[n] is M-symmetric, then Vx[k] achieves global maximum at k=M. Using Eq. 3

$$(x[n])(x[k-n]) = \frac{1}{2}(x^2[n] + x^2[k-n] - (x[n] - x[k-n])^2) \quad \text{(Eq. 3)}$$

then $V_x[k]$ cannot exceed $V_x[M]$ for any k. This is shown in Eq. 4.

$$V_x[k] = \sum_{n\in Z}(x[n])(x[k-n]) = \sum_{n\in Z}(x^2[n]) - \frac{1}{2}\sum_{n\in Z}(x[n] - x[k-n])^2 = \sum_{n\in Z}(x[n]x[M-n]) - \frac{1}{2}\sum_{n\in Z}(x[n] - x[k-n])^2 \leq V_M[k] \quad \text{(Eq. 4)}$$

So the symmetric center of the signal can be determined from peaks in its autoconvolution function.

If x[n] is both T-periodic and M-symmetric, then the autoconvolution function Vx[k] achieves global maximum at k=M+jT for every j∈Z. This can be used for pitch detection for a three-dimensional structure.

Figure 2C:
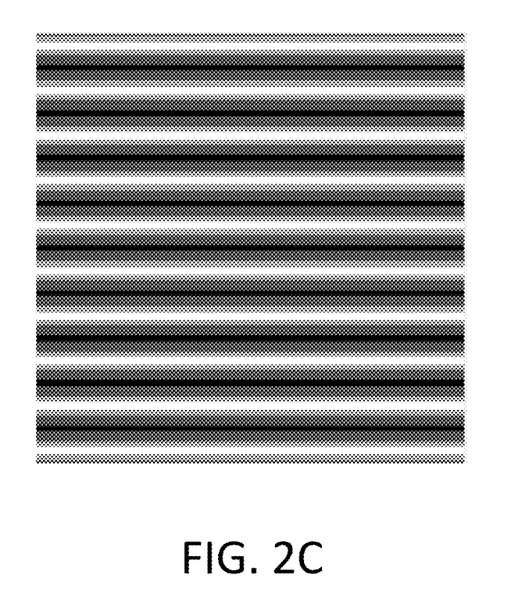
FIG. 2C illustrates a corresponding mask image to FIG. 2A.

With the period and trench centers identified, a mask image is generated from the one-dimensional curve of the image at 106, such as that in FIG. 2C. The mask image can be based on predefined widths of trench area and each hole region. Thus, the trench center can be used as a reference. Trench, edge hole, transition hole, and center hole regions can be determined in the mask image, as shown in FIG. 1. The transition holes and center holes are outlined with dashed lines in FIG. 1. The edge holes are an outside row of a group of holes closest to the trench, center holes are at a center of a group of holes, and the transition holes are between the edge holes and the center holes. In an instance, after a trench center is determined, within a period, the trench center is segmented into subregions based on sensitivity thresholds to generate the mask image.

In an instance, the semiconductor manufacturer can specify sensitivity in different regions for the mask based on the semiconductor structure or other design. Thus, the mask can indicate a region of pixels with particular sensitivity. A semiconductor manufacturer can set a sensitivity on a BBP inspection system for each subregion such that each subregion can use an independent threshold.

The pixels of the image from 101 can be segmented based on the mask from 106 for detection of individual segmentation.

Defects on the image are detected with the mask at 107. For example, defects can be detected amongst pixels in a region of the mask with desired sensitivity. Detecting the defects can include extracting a patch around a location of one of the defects. In an example, the patch size is 32×32 pixels for a BBP inspection system. A distance between a defect to a neighboring trench center can be determined. After the trench center is calculated, and for each defect, the defect peak location can also be found. The distance is the difference between these two values. This distance can be used for defect binning. In an instance, a local maximal in a patch difference image can represent a defect.

Defect locations can be calculated at 108. Location-based binning can be performed at 109 based on a distribution. The results of the location-based binning can be turned into a histogram, such as that shown in FIG. 3. In an example, the distribution of defects with respect to distance-to-trench-center is the final binning result. This can be used to determine locations of the defects of interest.

The operation is further described in the example below. Let x[n] be a real-valued discrete signal. This is T-periodic if there exists a positive integer T s.t. x[n]=x[n+T] for every n∈ ℤ and this is M-symmetric if there exists an integer M s.t. x[n]=x[M−n] for every n∈ ℤ. In this case, M/2 is one of the symmetric centers (not necessarily unique). It can be verified if a signal is both T-periodic and M-symmetric. It also is (M+jT)-symmetric for every j∈ ℤ. As a result, a periodic and symmetric signal contains a series of symmetric centers with half-period spacing.

For auto-correlation and auto-convolution, the cross-correlation function can be used to detect the periodicity and symmetry. Note that a periodic and symmetric signal will overlay with itself at every multiple of period. Therefore, the cross-correlation function of the signal with itself will reach maxima at a series of points with one-period spacing. This type of cross-correlation function is referred to as the auto-correlation function. Moreover, the signal will also overlay with its reversion at every multiple of period. Thus, the cross-correlation function of the signal with its reversion will contain a series of peaks, each of which corresponds to a symmetric center of the original signal. This type of cross-correlation function is defined as the auto-convolution function. In summary, the periodicity and symmetry can be determined from the auto-correlation and auto-convolution functions respectively.

Suppose that the projection data is given by x[0], x[1], . . . , x[N−1]. The mean and variance can be defined as follows in Eq. 5.

$$\mu = \frac{1}{N}\sum_{n=0}^{N-1}x[n], \sigma^2 = \frac{1}{N}\sum_{n=0}^{N-1}(x[n] - \mu)^2, \quad \text{(Eq. 5)}$$

An estimate of the auto-correlation and auto-convolution at a positive lag k may be obtained using Eq. 6.

$$R_x[k] = \frac{1}{N-k}\sum_{n=0}^{N-1-k}(x[n] - \mu)(x[n+k] - \mu),$$

$$V_x[k] = \frac{1}{k+1}\sum_{n=0}^{k}(x[n] - \mu)(x[k-n] - \mu). \quad \text{(Eq. 6)}$$

The expression for negative lag k can be defined likewise. It may be convenient to normalize the auto-correlation $R_x[k]$ and auto-convolution $V_x[k]$ functions using Eq. 7.

$$r_x[k] = \frac{R_x[k]}{\sigma^2}, v_x[k] = \frac{V_x[k]}{\sigma^2}. \quad \text{(Eq. 7)}$$

The terms auto-correlation and auto-convolution can represent the normalized version.

The periodicity and symmetry can be inferred from the auto-correlation and auto-convolution functions. All the peaks which are higher than a given threshold value can be initially found. The pitch can then be identified as the average interval of the peaks.

With the pitch T obtained, the trench center can be further determined. Suppose that the peaks of auto-convolution function occur at $m_0 < m_1 < \ldots < m_{L-1}$. Due to the presence of wafer noise, some of the expected peak may be missing. M can be found such that $M+j_l T \approx m_l, l=0, 1, \ldots, L-1$, for some unknown $j_l \in \mathbb{Z}$. Therefore, the following optimization problem with respect to M, $j_0, \ldots, j_{L-1}$.

$$\min \sum_{l=0}^{L-1}(M + j_l T - m_l)^2 \text{ s.t. } j_0, \ldots, j_{L-1} \in \mathbb{Z} \quad \text{(Eq. 8)}$$

Without a loss of generality, M may be restricted in the range [−T/2, T/2). The optimal solution M* of the problem Eq. 8 can belong to the following candidate set $\{\bar{q}, \bar{q}-\Delta, \ldots, \bar{q}-L\Delta\} \cap [-T/2, T/2)$, where $$\bar{q} = \sum_{l=0}^{L-1} q_l, \Delta = \frac{T}{L},$$

and $q_l \in [0, T)$ is the remainder of $m_l$ with respect to T. Consequently, the value of objective function on the candidate set can be compared and the minimizer M* can be found.

As shown in 3D NAND images, half-pitch ambiguity can exist on the trench center, either in bright center or dark center. An arbitration may be required to determine the correct trench center. It can be difficult to determine the trench polarity from the projection data alone. There are at least three ways for arbitration. A first is using brightness from observation. A second is to use horizontal variance because a hole region typically has more wafer noise. A third is to predefine a template to match the wafer pattern. Since there can be layer-to-layer, wafer-to-wafer, and die-to-die variations, an empirical choice of arbitration method may be applied to each specific layer.

The obtained trench center can be used as reference. Trench, edge hole, transition hole, and center hole regions can be filled one by one with corresponding percentages repeatedly in the mask image. Using the mask image, segmented multi-die automatic thresholding (MDAT) detection is performed to detect defects for each segmentation.

When there are global GL variations, some frames may suffer from wrong pitch and trench center. A borrow logic may be implemented to get pitch and trench center values from other frames. Thus, values of period and trench centers can be borrowed from neighboring frames. Frame to frame offsets may be considered during the borrowing.

Figure 4:
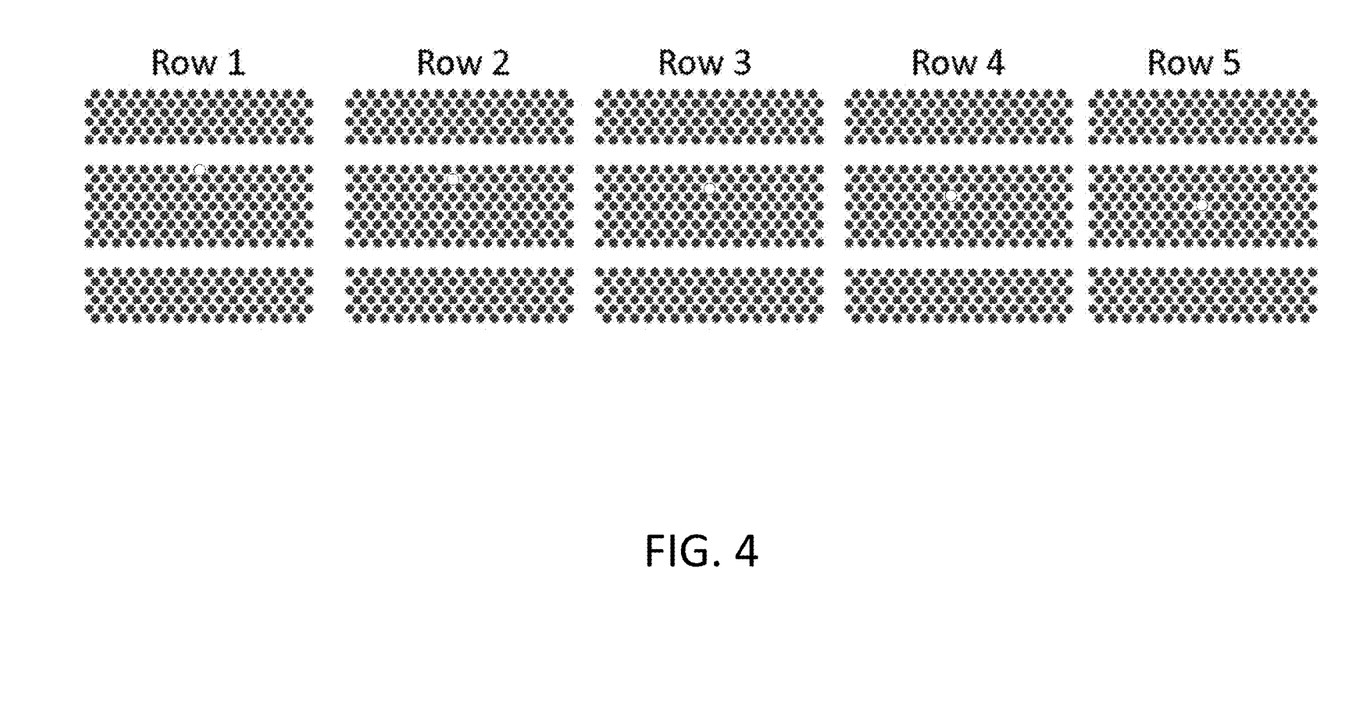
FIG. 4 illustrates an example of programmed missing defects.

In an experiment, the method 100 was tested on a wafer using a BBP inspection system. Performance was compared to IBS. There are programmed hole missing defects on the wafer as shown in FIG. 4. Each dot in FIG. 4 is a channel hole. Missing defects exist in row 1 to row 5, which are shown with the hollow circles in FIG. 4. The objective is to differentiate defects from distinct rows.

Figure 5:
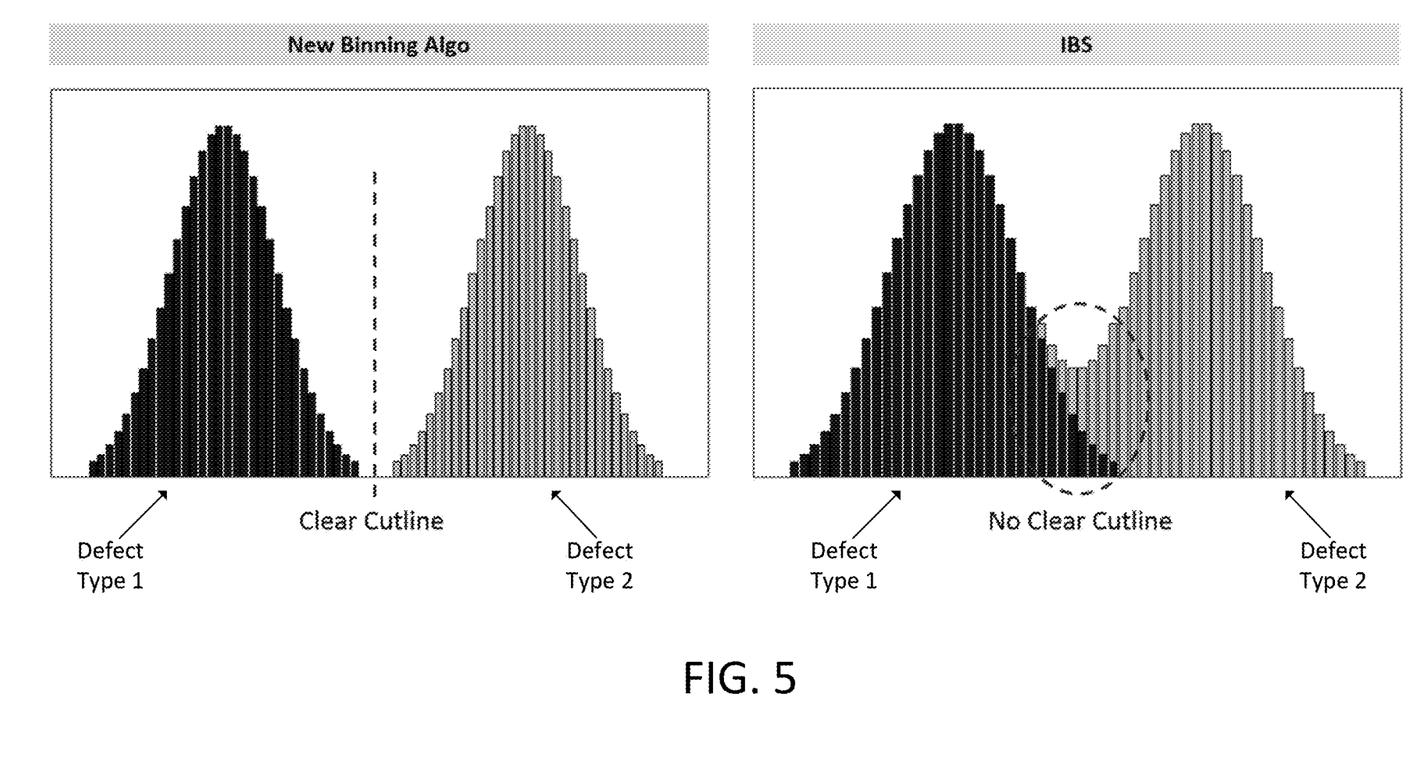
FIG. 5 illustrates histograms comparing a method embodiment of the present disclosure and IBS.

The distance of defect to trench center is calculated as an attribute of defects for binning in the prototype development. The histograms in FIG. 5 show that the embodiments disclosed herein ("new binning algo") can find clear cutline to separate two different types of defects, while there is a large overlap between distribution of two types of defects by using IBS. The overall binning accuracy is improved using the embodiments disclosed herein due to the clear cutline on the histogram.

Using a-priori information (e.g. periodicity, symmetry, etc.) of wafer layout can overcome influences of GL variations and auto-focus issues. Embodiments disclosed herein can separate defects on different rows of channel holes to corresponding bins correctly and help semiconductor manufacturers achieve enhanced sensitivity tuning and precise defectivity monitoring for better control of wafer yield.

Figure 6:
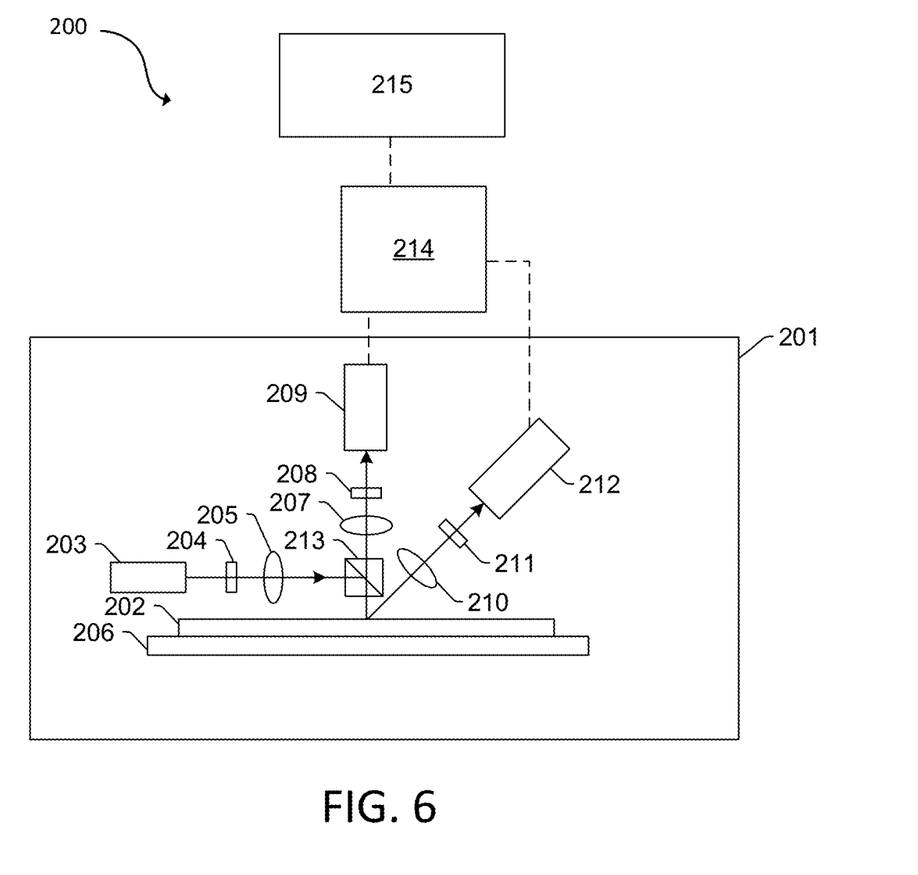
FIG. 6 is a block diagram of a system in accordance with the present disclosure.

One embodiment of a system 200 is shown in FIG. 6. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen 202 includes a reticle. The reticle may include any reticle known in the art.

In the embodiment of the system 200 shown in FIG. 6, optical based subsystem 201 includes an illumination subsystem configured to direct light to specimen 202. The illumination subsystem includes at least one light source. For example, as shown in FIG. 6, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 6, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 6. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 6 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 6) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a BBP source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 6 as a single refractive optical element, it is to be understood that, in practice, lens 205 may include a number of refractive and/or reflective optical elements that in combination focus the light from the optical element to the specimen. The illumination subsystem shown in FIG. 6 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 6 includes two detection channels, one formed by collector 207, element 208, and detector 209 and another formed by collector 210, element 211, and detector 212. As shown in FIG. 6, the two detection channels are configured to collect and detect light at different angles of collection. In some instances, both detection channels are configured to detect scattered light, and the detection channels are configured to detect tight that is scattered at different angles from the specimen 202. However, one or more of the detection channels may be configured to detect another type of light from the specimen 202 (e.g., reflected light).

As further shown in FIG. 6, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 6 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 6 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 6 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 6 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection system, a wafer metrology system, or a wafer review system (not illustrated) to receive additional information or send instructions. For example, the processor 214 and/or the electronic data storage unit 215 can be in electronic communication with a scanning electron microscope.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The location-based binning using the processor 214 can separate the defects on different rows of channel holes to corresponding bins. The processor 214 is configured to receive an image of the semiconductor wafer; generate a one-dimensional projection of the image thereby forming a one-dimensional curve; generate a mask from the one-dimensional curve of the image; detect defects on the image with the mask; and perform location-based binning of the defects.

Generating the mask can include performing an auto-correlation of the one-dimensional curve thereby determining a period and performing auto-convolution and arbitration of the period thereby determining a trench center. The trench center can be used as a reference. Trench, edge hole, transition hole, and center hole regions can be determined in the mask image.

The defects can be detected amongst pixels in a region of the mask. Detecting the defects can further include extracting a patch around a location of one of the defects. A distance to a neighboring trench center can be determined for each defect. For example, this can be a distance from a defect, an edge of a patch, or a center of a patch to a neighboring trench. The location-based binning can be a distance-to-trench-center.

An additional embodiment relates to a non-transitory computer-readable medium storing program instructions executable on a controller for performing a computer-implemented method for defect detection, as disclosed herein. In particular, as shown in FIG. 6, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
receiving an image at a processor, wherein the image is of a three-dimensional structure of a semiconductor wafer;
generating a one-dimensional projection of the image using the processor thereby forming a one-dimensional curve;
generating a mask from the one-dimensional curve of the image using the processor, wherein generating the mask includes:
performing an auto-correlation of the one-dimensional curve using the processor thereby determining a period; and
performing auto-convolution and arbitration of the period using the processor thereby determining a trench center;
detecting defects on the image with the mask using the processor; and
performing location-based binning of the defects using the processor.

2. The method of claim 1, wherein the image is generated by a broad-band plasma inspection system.

3. The method of claim 1, wherein the three-dimensional structure is a three-dimensional NAND structure.

4. The method of claim 1, wherein the trench center is used as a reference, and wherein trench, edge hole, transition hole, and center hole regions are determined in a mask image using the processor.

5. The method of claim 1, wherein the defects are detected amongst pixels in a region of the mask.

6. The method of claim 1, wherein detecting the defects further includes extracting a patch around a location of one of the defects.

7. The method of claim 6, wherein the method further comprises determining a distance to a neighboring trench center using the processor.

8. The method of claim 7, wherein the location-based binning is a distance-to-trench-center.

9. The method of claim 1, wherein the location-based binning separates the defects on different rows of channel holes to corresponding bins.

10. A non-transitory computer readable medium storing a program configured to instruct a processor to execute the method of claim 1.

11. A system comprising:
a stage configured to hold a semiconductor wafer;
a light source configured to direct a beam of light at the semiconductor wafer on the stage;
a detector configured to receive reflected light from the semiconductor wafer on the stage; and
a processor in electronic communication with the detector, wherein the detector is configured to:
receive an image of the semiconductor wafer;
generate a one-dimensional projection of the image thereby forming a one-dimensional curve;
generate a mask from the one-dimensional curve of the image, wherein generating the mask includes:
performing an auto-correlation of the one-dimensional curve thereby determining a period; and
performing auto-convolution and arbitration of the period thereby determining a trench center;
detect defects on the image with the mask; and
perform location-based binning of the defects.

12. The system of claim 11, wherein the light source is a broad-band plasma source.

13. The system of claim 11, wherein the trench center is used as a reference, and wherein trench, edge hole, transition hole, and center hole regions are determined in a mask image.

14. The system of claim 11, wherein the defects are detected amongst pixels in a region of the mask.

15. The system of claim 11, wherein detecting the defects further includes extracting a patch around a location of one of the defects.

16. The system of claim 15, wherein the method further comprises determining a distance to a neighboring trench center.

17. The system of claim 16, wherein the location-based binning is a distance-to-trench-center.

18. The system of claim 11, wherein the location-based binning separates the defects on different rows of channel holes to corresponding bins.

* * * * *